United States Patent
Hsu et al.

(10) Patent No.: US 9,997,943 B2
(45) Date of Patent: Jun. 12, 2018

(54) ELECTRONIC DEVICE AND POWER ADAPTER CAPABLE OF COMMUNICATING WITH EACH OTHER, AND ASSOCIATED CHARGING SYSTEM

(71) Applicant: MEDIATEK INC., Hsin-Chu (TW)

(72) Inventors: Chih-Yuan Hsu, Hsinchu (TW); Chuan-Chang Lee, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 245 days.

(21) Appl. No.: 14/738,936

(22) Filed: Jun. 15, 2015

(65) Prior Publication Data
US 2016/0172874 A1    Jun. 16, 2016

Related U.S. Application Data

(60) Provisional application No. 62/090,872, filed on Dec. 11, 2014.

(51) Int. Cl.
*H02J 7/00* (2006.01)
*G06F 1/28* (2006.01)
*G01R 31/42* (2006.01)

(52) U.S. Cl.
CPC .............. *H02J 7/007* (2013.01); *G01R 31/42* (2013.01); *G06F 1/28* (2013.01); *H02J 2007/0096* (2013.01)

(58) Field of Classification Search
CPC .. H02J 7/007; H02J 2007/0096; G01R 31/42; G06F 1/28

USPC ................ 320/107, 133, 134, 162
See application file for complete search history.

(56) References Cited

U.S. PATENT DOCUMENTS

| 2006/0220465 | A1 | 10/2006 | Kingsmore, Jr. |
| 2010/0188238 | A1 | 7/2010 | Yasuda |
| 2012/0071215 | A1 | 3/2012 | Bourque |
| 2013/0181658 | A1 | 7/2013 | Danner |
| 2013/0232348 | A1 | 9/2013 | Oler |
| 2014/0331067 | A1* | 11/2014 | Chen ....................... G06F 1/266 713/322 |

FOREIGN PATENT DOCUMENTS

| CN | 102013705 A | 4/2011 |
| CN | 104133543 A | 11/2014 |
| EP | 1 555 733 A2 | 7/2005 |
| EP | 1555733 A2 | 7/2005 |
| JP | 2001245476 | 9/2001 |
| JP | 2001245476 A | 9/2001 |

* cited by examiner

*Primary Examiner* — Edward Tso
*Assistant Examiner* — Aaron Piggush
(74) *Attorney, Agent, or Firm* — Winston Hsu (57) ABSTRACT

A charging system comprises an electronic device and a power adapter for charging the electronic device. The electronic device has a bi-directional communication with the power adapter; and the electronic device is arranged to send a health check command to the power adapter, and the power adapter performs a self-health check operation and reports a checking result to the electronic device. In addition, the electronic device may calculate a cable impedance, and control a compensation function of the power adapter by referring to the calculated cable impedance.

14 Claims, 7 Drawing Sheets

ELECTRONIC DEVICE AND POWER ADAPTER CAPABLE OF COMMUNICATING WITH EACH OTHER, AND ASSOCIATED CHARGING SYSTEM

CROSS REFERENCE TO RELATED APPLICATIONS

This application claims the priority of U.S. Provisional Application No. 62/090,872, filed on Dec. 11, 2014, which is included herein by reference in its entirety.

BACKGROUND

If an AC-DC adapter uses circuit elements with poor quality or insulation degradation occurs, an AC current or a surge pulse may be transmitted to an electronic device charged by the AC-DC adapter, causing danger to a user. In addition, a connector of the electronic device may suffer a burn down risk when an output current of the AC-DC adapter is larger than connector/cable capability.

SUMMARY

It is therefore an objective of the present invention to provide an electronic device and power adapter capable of communicating with each other, and associated charging system, to solve the above-mentioned problems.

According to one embodiment of the present invention, a charging system comprises an electronic device and a power adapter for charging the electronic device. The electronic device has a bi-directional communication with the power adapter; and the electronic device sends a health check command to the power adapter, and the power adapter performs a self-health check operation and reports a checking result to the electronic device.

According to another embodiment of the present invention, a controller applied to an electronic device is arranged to send a health check command to the power adapter via the communication unit to ask for a checking result generated by performing a self-health check operation upon the power adapter.

According to another embodiment of the present invention, an operating method of an electronic device coupled to a power adapter comprises: sending a health check command to the power adapter to ask for a checking result generated by performing a self-health check operation upon the power adapter.

According to another embodiment of the present invention, a power adapter comprises a communication unit and a health check circuitry. When the communication unit receives a health check command from the electronic device, the health check circuitry performs a self-health check operation and reports a checking result to the electronic device via the communication unit.

According to another embodiment of the present invention, a charging system comprises an electronic device and a power adapter, where the power adapter is coupled to the electronic device via a cable, and comprises a compensation function to compensate at least a level of an output voltage supplied to the electronic device. The electronic device is arranged to send a command to the power adapter to disable the compensation function, and during a period that the compensation function is disabled, the electronic device calculates a cable impedance according to received voltages and corresponding sinking currents from the cable.

According to another embodiment of the present invention, a controller applied to an electronic device is disclosed, wherein the electronic device is coupled to a power adapter via a cable. The controller is arranged to send a command to the power adapter to disable a compensation function of the power adapter, wherein the compensation function is arranged to compensate at least a level of an output voltage supplied to the electronic device; and during a period that the compensation function is disabled, the controller calculates a cable impedance according to received voltages and corresponding sinking currents from the cable.

According to another embodiment of the present invention, an operating method of an electronic device is disclosed, wherein the electronic device is coupled to a power adapter via a cable, and the method comprises: sending a command to the power adapter to disable a compensation function of the power adapter, wherein the compensation function is arranged to compensate at least a level of an output voltage supplied to the electronic device; during a period that the compensation function is disabled, calculating a cable impedance according to received voltages and corresponding sinking currents from the cable; and controlling the compensation function of the power adapter according to the calculated cable impedance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
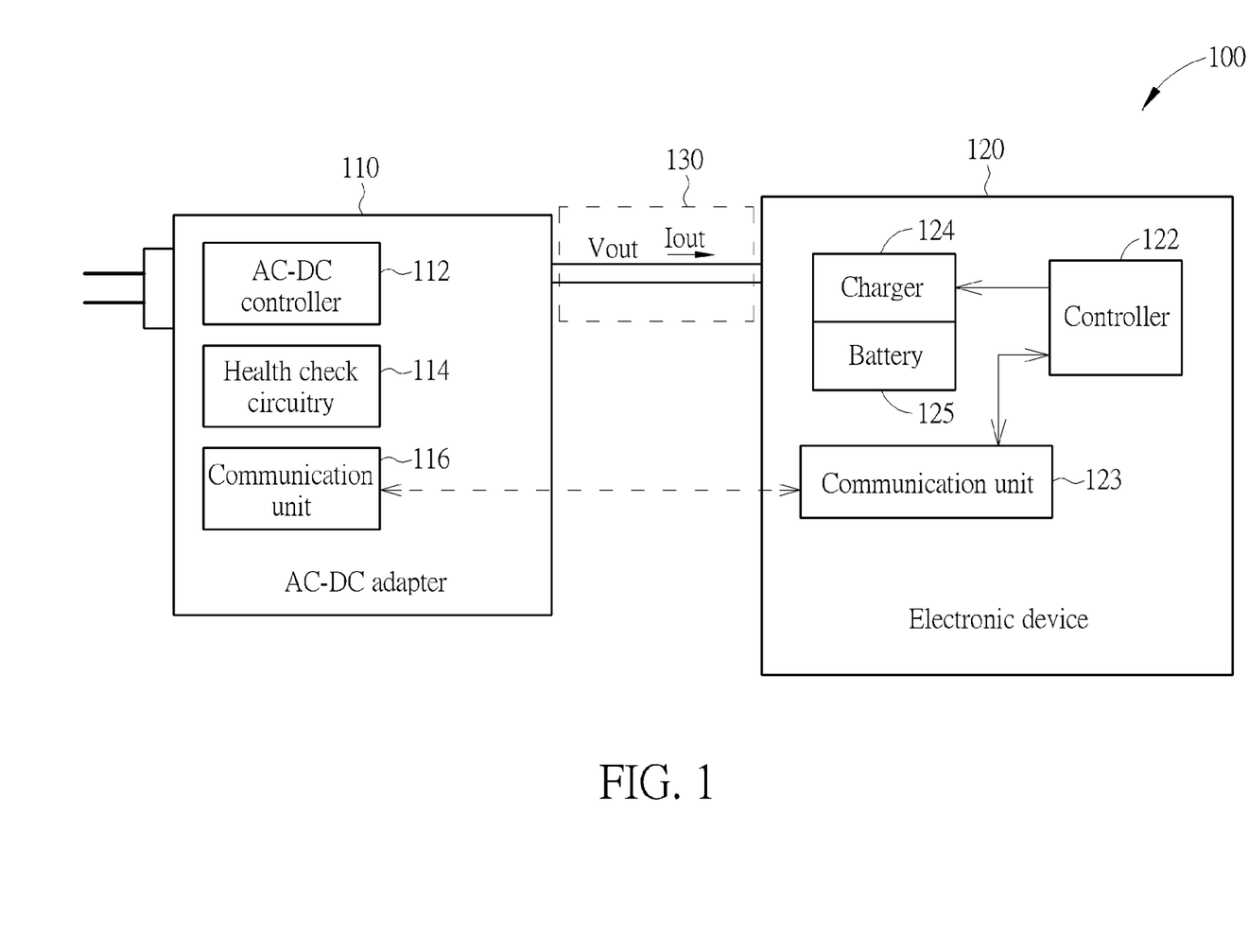
FIG. 1 is a diagram illustrating a charging system according to one embodiment of the present invention.

Please refer to FIG. 1, which is a diagram illustrating a charging system 100 according to one embodiment of the present invention. As shown in FIG. 1, the charging system 100 comprises a power adapter (in this embodiment, the power adapter is an AC-DC adapter 110, but it's not a limitation of the present invention) and an electronic device 120, where the AC-DC adapter 110 is connected to the electronic device 120 via a cable 130, and the AC-DC adapter 110 provides an output voltage Vout (the output voltage Vout may comprise two voltages V+ and V−) to the electronic device 120. In this embodiment, the electronic device 120 may be a portable device such as a cell phone, smart phone, tablet . . . etc. or any other electronic device required to be charged by a power adapter.

The AC-DC adapter 110 comprises an AC-DC controller 112, a health check circuitry 114 and a communication unit 116, where the AC-DC controller 112 is arranged to receive external AC power to generate the stable output voltage Vout, the health check circuitry 114 is arranged to perform a self-health check operation upon the AC-DC adapter 110, and the communication unit 116 is arranged to communicate with the electronic device 120. In one embodiment, at least a portion of the health check circuitry 114 may be incorporated into the AC-DC controller 112. In addition, the electronic device 120 comprises a controller 122, a communication unit 123, a charger 124 and a battery 125. The controller 122 is arranged to control the charger 124 and perform some operations of the electronic device 120, and the charger 124 is arranged to charge the battery 125 according to the output voltage Vout and a sinking current Iout provided by the AC-DC adapter 110. The communication unit 123 is arranged to communicate with the AC-DC adapter 110.

In this embodiment, the AC-DC controller 112 may have interface such as Universal Serial Bus (USB), USB power delivery (USB PD), USB D+/D− or any other suitable interface. The circuits within the AC-DC adapter 110 may have an inter-integrated circuit (I2C) interface or a one wire (1-Wire) interface or any other suitable interface. In addition, the electronic device 120 has a bi-directional communication with the AC-DC adapter 110. In this embodiment, the communication unit 116 and the communication unit 123 may have any suitable wireless communication interface such as Bluetooth (BT) or Bluetooth Low Energy (BT BLE).

Figure 2:
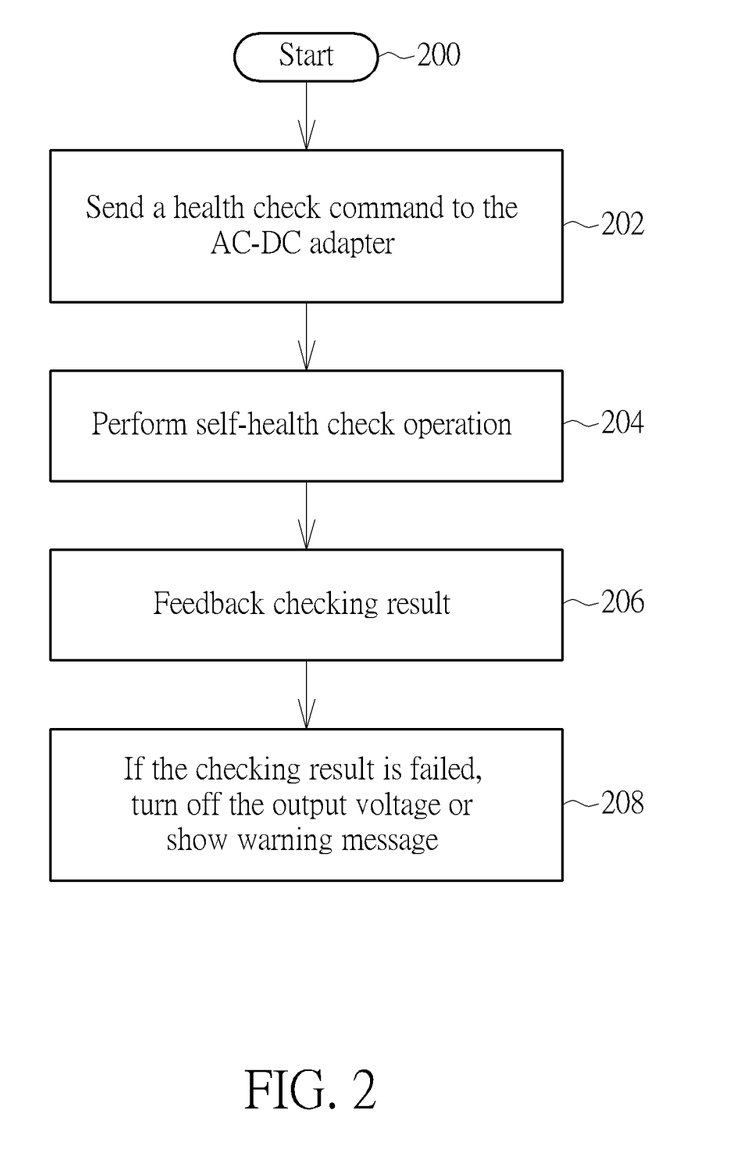
FIG. 2 is a flow chart of operations of the charging system shown in FIG. 1 according to one embodiment of the present invention.

FIG. 2 is a flow chart of operations of the charging system 100 according to one embodiment of the present invention. Refer to FIG. 1 and FIG. 2 together, the flow is as follows.

In Step 200, the flow starts, at this time the AC-DC adapter 110 is connected to the electronic device 120 via the cable 130, and the electronic device 120 is capable of communicating with the AC-DC adapter 110. In Step 202, the controller 122 of the electronic device 120 sends a health check command to the AC-DC adapter 110 via the communication unit 123 to ask for a checking result generated by performing a self-health check operation upon the AC-DC adapter 110. After the electronic device 120 sends the health check command to the AC-DC adapter 110, the controller 122 may control the charger 124 not sink current from the AC-DC adapter 110 for a period of time, that is the battery 125 is not charged during this period; or the controller 122 may control the charger 124 to decrease a sinking current from the AC-DC adapter 110 for the period of time.

In Step 204, the AC-DC adapter 110 receives the health check command from the electronic device 120, and during the period that the electronic device 120 does not sink current or the sinking current is decreased, the health check circuitry 114 of the AC-DC adapter 110 performs the self-health check operation to generate a checking result. In one embodiment, the health check circuitry 114 may perform the self-health check operation by determining whether a switching frequency is greater than a predetermined value or not to generate to the checking result, or the health check circuitry 114 may perform the self-health check operation by checking an output current, a leakage current or the output voltage Vout.

Figure 3:
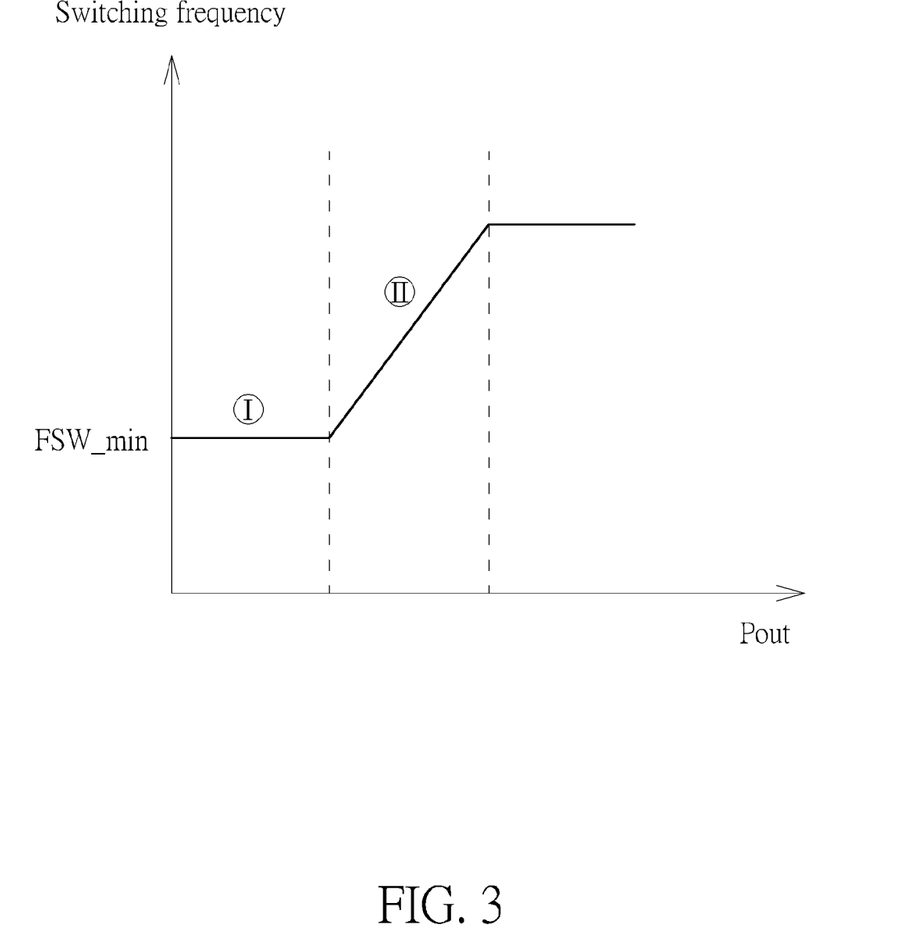
FIG. 3 is a diagram illustrating a curve between the switching frequency and an output power of the AC-DC adapter.

In detail, refer to FIG. 3, which is a diagram illustrating a curve between the switching frequency and an output power Pout of the AC-DC adapter 110. In FIG. 3, in region "I", the AC-DC adapter 110 has no load or light load, and because of a quiescent current existed in the AC-DC adapter 110, the switching frequency is in a minimum value FSW_min to make the AC-DC controller 112 periodically pull high the output voltage Vout to maintain the stable output voltage Vout. In addition, in region "II", the switching frequency is increased to make the AC-DC controller 112 able to output larger power while the stable output voltage Vout is maintained. In light of above, during the period that the electronic device 120 does not sink current or the sinking current is decreased, the AC-DC adapter 110 should have no load or light load, that is the switching frequency should be equal to the minimum value FSW_min. Therefore, if the switching frequency is greater than the minimum value FSW_min during this period, there may be a defect in the AC-DC adapter 110. In addition, the above-mentioned "predetermined value" may be any suitable value greater than or equal to the minimum value FSW_min, and the AC-DC adapter 110 always maintains a level of the output voltage Vout.

In addition, the health check circuitry 114 may also check whether an output current or output voltage Vout is within a specific range, or check whether the leakage current is greater than a threshold, to generate the checking result.

In Step 206, after finishing performing the self-health check operation, the AC-DC adapter 110 may feedback the checking result to the electronic device 120. In one embodiment, the health check circuitry 114 or other circuit may send the checking result to the electronic device 120 via the communication unit 116 and the communication unit 123. In another embodiment, the health check circuitry 114 may report the checking result by changing the output voltage Vout to notify the AC-DC controller 112. For example, if the checking result indicates that there is a defect in the AC-DC adapter 110, the AC-DC controller 112 may stop outputting the output voltage Vout to the electronic device 120; and if the checking result indicates that there is no defect in the AC-DC adapter 110, the AC-DC controller 112 may maintain the output voltage Vout, that is, the electronic device 120 may obtain the checking result by determining the received voltage Vout.

In Step 208, if the checking result indicates that there is a defect in the AC-DC adapter 110, the AC-DC adaptor 110 may enable a self-protection function or stop outputting the output voltage Vout, and the electronic device 120 may stop sinking current or charging the battery 125 or showing a warning message on a screen.

The flow in FIG. 2 may be executed in any appropriate time which is determined according to designers' consideration. For example, the flow may be executed once the AC-DC adapter 110 is connected to the electronic device 120, or the flow may be periodically executed.

In the above-mentioned embodiment, only when receiving health check command from the electronic device 120 will the AC-DC adapter 110 perform the self-health check operation, that is the health check command triggers the AC-DC adapter 110 to perform the self-health check operation. However, in other embodiments of the present invention, the electronic device 120 may be actively perform the self-health check operation without receiving the health check command from the electronic device 120, and the electronic device 120 may report the checking result to the electronic device 120. These alternative designs shall fall within the scope of the present invention.

Figure 4:
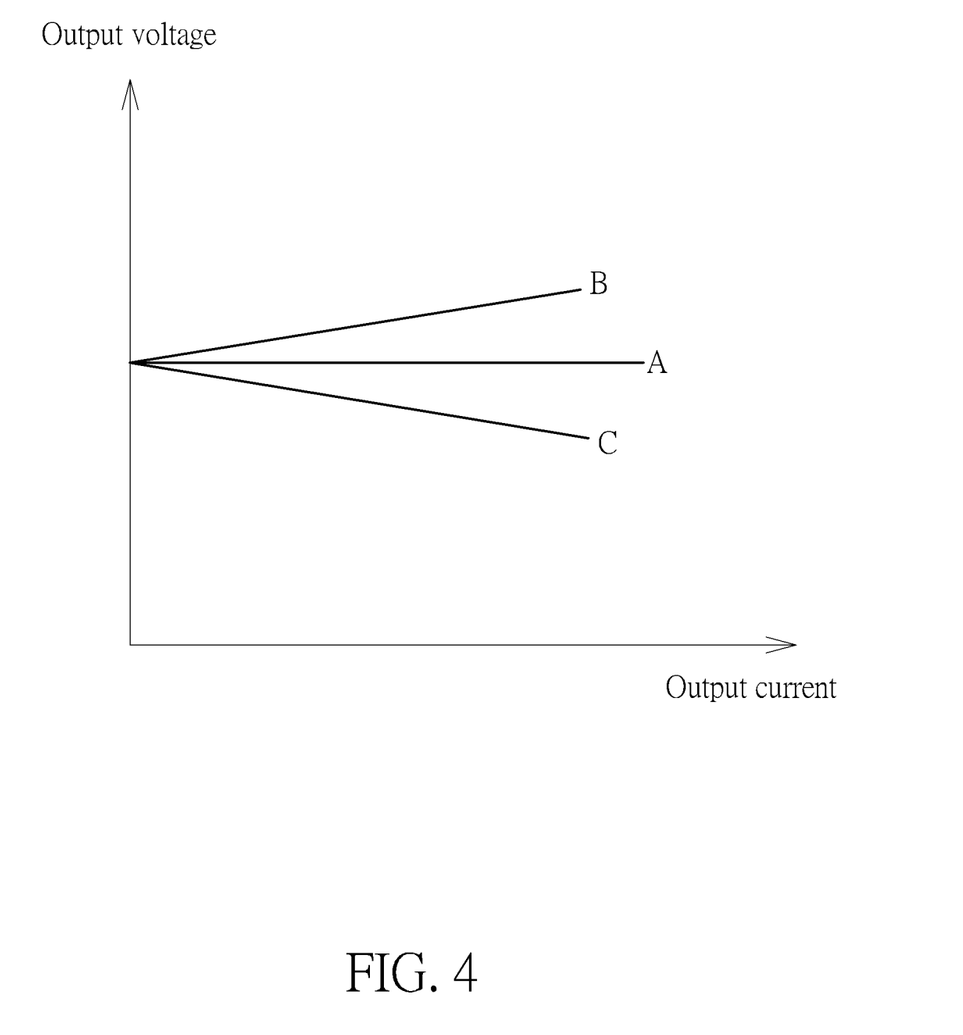
FIG. 4 is a diagram illustrating relationship between an output current and an output voltage of the AC-DC adapter for three cases.

In the charging system 100 shown in FIG. 1, when the charging current provided by the AC-DC adapter 110 is large, the cable 130 or the connector of the AC-DC adapter 110 or the electronic device 120 may be hot or burned if the cable 130 or the connector has large impedance. Therefore, to prevent the charging system 100 from this risk, the impedance of the cable 130 needs to be accurately calculated for setting appropriate charging current and/or charging voltage. Therefore, in one embodiment, the AC-DC controller 112 may include a compensation function (cable IR compensation function) to compensate the output voltage Vout. Refer to FIG. 4, which is a diagram illustrating relationship between an output current and an output voltage of the AC-DC adapter 110 for three cases. In FIG. 4, the curve "A" shows stable voltage regulation (no voltage compensation); regarding curve "B", the output voltage is increased when the output current is increased to compensate the IR drop caused by the cable 130; and the curve "C" shows a worse voltage regulation. However, for the curve "B", because the cable impedance is unknown, the compensation may not be appropriate.

Figure 5:
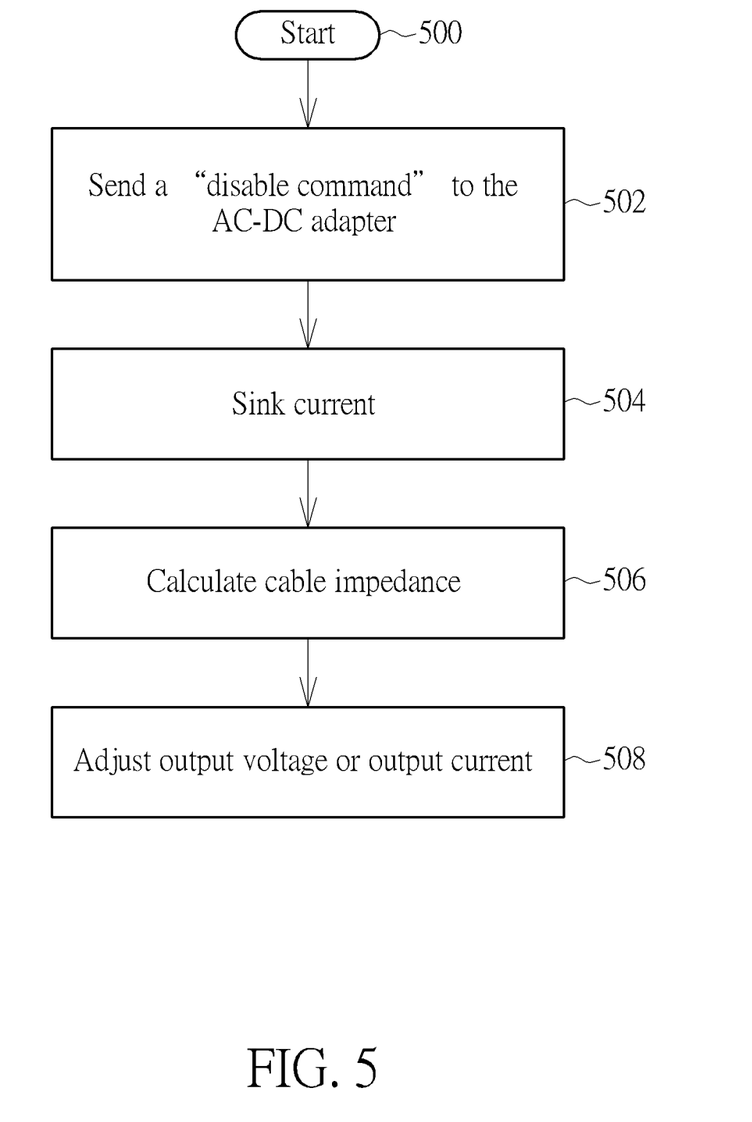
FIG. 5 is a flow of operations of the charging system shown in FIG. 1 according to another embodiment of the present invention.

To solve the above-mentioned problem and to compensate the IR drop better, FIG. 5 provides a flow of operations of the charging system 100 according to another embodiment of the present invention. Refer to FIG. 1 and FIG. 5 together, the flow is as follows.

In Step 500, the flow starts, and at this time the AC-DC adapter 110 is connected to the electronic device 120 via the cable 130, and the electronic device 120 is capable of communicating with the AC-DC adapter 110. In Step 502, the controller 122 of the electronic device 120 sends a "disable command" to the AC-DC adapter 110 to disable the cable IR compensation function of the AC-DC controller or decrease a compensation level of the cable IR compensation function, that is, the output voltage of the AC-DC adapter 110 is not changed or slightly changed with the change of the output current.

Figure 6:
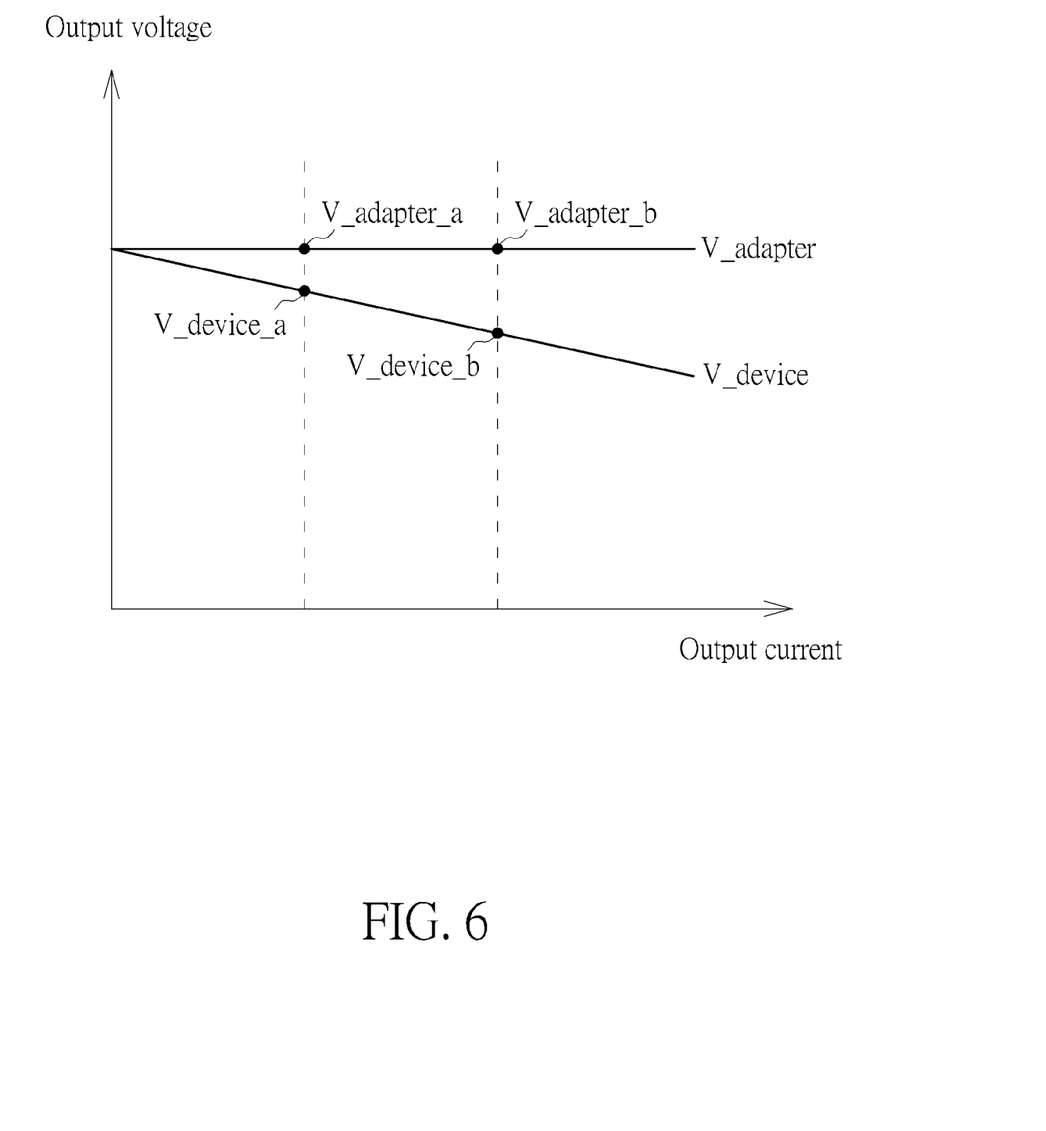
FIG. 6 is a diagram illustrating how to exactly calculate the cable impedance according to one embodiment of the present invention.

In Step 504, during a period that the compensation function of the AC-DC controller 112 is disabled or the compensation level is decreased, the controller 122 controls the charger 124 to sink at least two different currents from the cable 130. In Step 506, the controller 122 of the electronic device 120 calculates the cable impedance according to the sinking currents from the cable 130. In detail, refer to FIG. 6, which is a diagram illustrating how to exactly calculate the cable impedance according to one embodiment of the present invention. In FIG. 6, during the period that the compensation function of the AC-DC controller 112 is disabled or the compensation level is decreased, the controller 122 controls the charger 124 to sink a current Ia, and measure the received voltage V_device_a; then the controller 122 controls the charger 124 to sink a current Ib, and measure the received voltage V_device_b. Then, by referring to the following two equations:

$$V\_device\_a = V\_adapter\_a - Ia*R;$$

$$V\_device\_b = V\_adapter\_b - Ib*R;$$

the cable impedance R can be calculated by using the formula:

$$R = (V\_device\_a - V\_device\_b)/(Ia - Ib),$$

where V_adapter_a and V_adapter_b are output voltages at the adapter side, and V_adapter_a is equal to V_adapter_b due to no voltage compensation.

Figure 7:
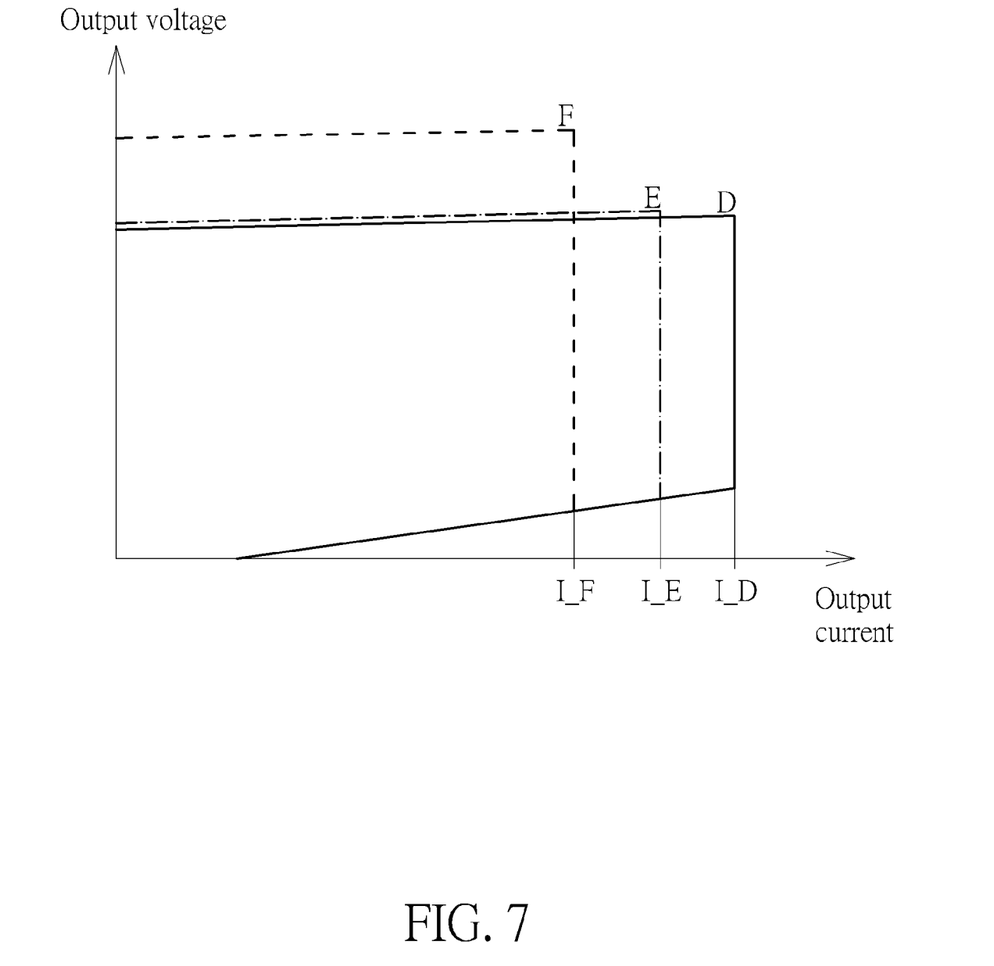
FIG. 7 shows output voltage and output current adjustments according to one embodiment of the present invention.

In Step 508, after the accurate cable impedance is obtained, the controller 122 of the electronic device 120 controls the AC-DC controller 112 to control the compensation function according to the calculated cable impedance. For example, the AC-DC controller 112 may adjust the output voltage and/or the output current of the AC-DC adapter 110 and/or adjust the slope of the curve "B" shown in FIG. 4 according to the calculated cable impedance. In addition, refer to FIG. 7, which shows output voltage and output current adjustments according to one embodiment of the present invention. In FIG. 7, a curve "D" is a default relationship between the output voltage and the output current, and when the cable impedance is large (that is the cable 130 has a worse quality), the AC-DC controller 112 may reduce a maximum output current which is allowed to be provided to avoid a burn down risk of the cable 130 due to the large current (i.e. a curve "E" shown in FIG. 7), and/or simultaneously increase a maximum output voltage to maintain or increase the output power of the AC-DC adapter 110 (i.e. a curve "F" shown in FIG. 7). In addition, in other embodiment, when that the cable impedance is large and the cable 130 has a worse quality, the electronic device 120 may lower the sinking current or show a warning message on the screen.

In light of above, in the charging system of the present invention, the electronic device has a bi-directional communication with the power adapter, and the electronic device may send a health check command to the power adapter to ask for a checking result generated by performing a self-health check operation upon the power adapter. In addition, the electronic device may be exactly calculate the cable impedance to make the power adapter able to generate the appropriate output voltage and output current to avoid the burn down risk.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charging system, comprising:
   an electronic device; and
   a power adapter, for charging the electronic device;
   wherein the electronic device has a bi-directional communication with the power adapter; the electronic device sends a health check command to the power adapter, and the power adapter performs a self-health check operation and reports a checking result to the electronic device;
   wherein after the electronic device sends the health check command to the power adapter, the electronic device decreases a sinking current from the power adapter; and during a period that the sinking current of the electronic device is decreased, the power adapter performs the self-health check operation by determining whether a switching frequency is greater than a predetermined value or not to generate to the checking result, and reports the checking result to the electronic device.

2. The charging system of claim 1, wherein the power adapter performs the self-health check operation by checking an output current, a leakage current or an output voltage.

3. A charging system, comprising:
an electronic device; and
a power adapter, for charging the electronic device;
wherein the electronic device has a bi-directional communication with the power adapter; the electronic device sends a health check command to the power adapter, and the power adapter performs a self-health check operation and reports a checking result to the electronic device;
wherein the power adapter further comprises a cable IR compensation function to compensate at least a level of an output voltage supplied to the electronic device; and the electronic device sends a command to the power adapter to disable the cable IR compensation function or decrease a compensation level of the cable IR compensation function, and during a period that the cable IR compensation function is disabled or the compensation level is decreased, the electronic device calculates a cable impedance according to received voltages and corresponding sinking currents from the cable.

4. The charging system of claim 3, wherein the electronic device further controls the compensation function of the power adapter according to the calculated cable impedance.

5. The charging system of claim 4, wherein the electronic device controls the compensation function of the power adapter to adjust the output voltage and/or an output current of the power adapter according to the calculated cable impedance.

6. The charging system of claim 3, wherein the electronic device further controls/adjusts a sinking current from the power adapter according to the calculated cable impedance.

7. A controller applied to an electronic device, arranged to send a health check command to a power adapter to ask for a checking result generated by performing a self-health check operation upon the power adapter; wherein the electronic device is coupled to a power adapter via a cable, and the controller is further arranged to send a command to the power adapter to disable a compensation function of the power adapter or decrease a compensation level of the compensation function, wherein the compensation function is arranged to compensate at least a level of an output voltage supplied to the electronic device; and during a period that the compensation function is disabled or the compensation level is decreased, the controller calculates a cable impedance according to received voltages and corresponding sinking currents from the cable.

8. The controller of claim 7, wherein after the controller sends the health check command to the power adapter, the controller controls the electronic device to decrease a sinking current from the power adapter.

9. The controller of claim 7, wherein the controller further controls the compensation function of the power adapter according to the calculated cable impedance.

10. The controller of claim 9, wherein the controller controls the compensation function of the power adapter to adjust the output voltage and/or an output current of the power adapter according to the calculated cable impedance.

11. The controller of claim 7, wherein the controller further controls/adjusts a sinking current from the power adapter according to the calculated cable impedance.

12. An operating method of an electronic device coupled to a power adapter, comprising:
sending a health check command to the power adapter to ask for a checking result generated by performing a self-health check operation upon the power adapter;
after sending the health check command to the power adapter, controlling the electronic device to decrease a sinking current from the power adapter;
receiving the checking result from the power adapter; and
determining whether to show a warning message or an alarm or not according to contents of the checking result;
wherein the electronic device is coupled to the power adapter via a cable, and the operating method further comprises:
sending a command to the power adapter to disable a compensation function of the power adapter or decrease a compensation level of the compensation function, wherein the compensation function is arranged to compensate at least a level of an output voltage supplied to the electronic device; and
during a period that the compensation function is disabled or the compensation level is decreased, calculating a cable impedance according to received voltages and corresponding sinking currents from the cable.

13. The operating method of claim 12, further comprising:
controlling the compensation function of the power adapter according to the calculated cable impedance.

14. The operating method of claim 13, further comprising:
controlling the compensation function to adjust the output voltage and/or an output current of the power adapter according to the calculated cable impedance.

* * * * *